United States Patent
Metzger

(10) Patent No.: US 10,854,861 B2
(45) Date of Patent: Dec. 1, 2020

(54) MOUNTING RACK FOR A POWER ELECTRONICS INSTALLATION AND INSTALLATION COMPRISING A MOUNTING RACK OF THIS KIND

(71) Applicant: Dr. Ing. h.c. F. Porsche Aktiengesellschaft, Stuttgart (DE)

(72) Inventor: Christian Metzger, Tamm (DE)

(73) Assignee: Dr. Ing. h.c. F. Porsche Aktiengesellschaft (DE)

( * ) Notice: Subject to any disclaimer, the term of this patent is extended or adjusted under 35 U.S.C. 154(b) by 103 days.

(21) Appl. No.: 16/026,490

(22) Filed: Jul. 3, 2018

(65) Prior Publication Data

US 2019/0020002 A1 Jan. 17, 2019

(30) Foreign Application Priority Data

Jul. 12, 2017 (DE) .......................... 10 2017 115 634

(51) Int. Cl.
*H01M 2/10* (2006.01)
*H01M 10/613* (2014.01)
(Continued)

(52) U.S. Cl.
CPC .......... *H01M 2/1016* (2013.01); *H01M 2/06* (2013.01); *H01M 2/1072* (2013.01); *H01M 10/0486* (2013.01); *H01M 10/613* (2015.04); *H05K 7/1432* (2013.01); *H05K 7/20927* (2013.01); *H01M 2220/10* (2013.01); *H01M 2220/20* (2013.01)

(58) Field of Classification Search
CPC .. H05K 7/1492; H05K 7/1489; H05K 7/1457; H05K 7/20836; H05K 7/183; G02B 6/3897; H02B 1/34; H02B 1/20; H02B 1/21; H02B 1/36; H02B 1/48; G06F 13/4068; G06F 1/20; H01M 2/1016; H01R 25/162; H01R 13/2492; H01R 9/2675; H01R 9/2408; H01R 9/2608
USPC ..... 361/622, 600, 679.02, 624, 637, 679.01, 361/679.46, 725, 728, 826
See application file for complete search history.

(56) References Cited

U.S. PATENT DOCUMENTS

| | | | |
|---|---|---|---|
| 5,001,602 A * | 3/1991 | Suffi | H04Q 1/028 361/724 |
| 2008/0266811 A1* | 10/2008 | Yamada | F24F 1/12 361/720 |

(Continued)

FOREIGN PATENT DOCUMENTS

| | | |
|---|---|---|
| CN | 101341648 A | 1/2009 |
| CN | 201966504 U | 9/2011 |

(Continued)

OTHER PUBLICATIONS

Chinese Office Action for Chinese Application No. 2018107508855, dated Feb. 3, 2020, 7 pages.

(Continued)

Primary Examiner — Mandeep S Buttar
(74) Attorney, Agent, or Firm — RatnerPrestia

(57) ABSTRACT

A mounting rack is described for a power electronics installation, including busbars for electrically connecting a plurality of assemblies, which busbars are arranged on the rear side of the mounting rack. A corresponding power electronics installation is also described.

12 Claims, 3 Drawing Sheets

(51) Int. Cl.
  *H01M 2/06*   (2006.01)
  *H01M 10/04*  (2006.01)
  *H05K 7/14*   (2006.01)
  *H05K 7/20*   (2006.01)

(56) References Cited

U.S. PATENT DOCUMENTS

| | | | | |
|---|---|---|---|---|
| 2009/0225500 A1* | 9/2009 | Cherney | ............. | H05K 7/1411 |
| | | | | 361/622 |
| 2010/0277847 A1* | 11/2010 | Li | ......................... | H02H 3/087 |
| | | | | 361/111 |
| 2011/0315353 A1* | 12/2011 | Campbell | .......... | H05K 7/20809 |
| | | | | 165/104.31 |
| 2012/0279233 A1* | 11/2012 | Chainer | ............. | H05K 7/20763 |
| | | | | 62/3.6 |
| 2013/0333865 A1* | 12/2013 | Goth | .................... | F28D 1/0477 |
| | | | | 165/104.31 |
| 2015/0180234 A1* | 6/2015 | Bailey | ....................... | H02J 1/10 |
| | | | | 307/12 |

FOREIGN PATENT DOCUMENTS

| | | | |
|---|---|---|---|
| CN | 106505415 | A | 3/2017 |
| WO | 2007027889 | A2 | 3/2007 |
| WO | 2013037392 | A1 | 3/2013 |
| WO | 2013051583 | A1 | 4/2013 |

OTHER PUBLICATIONS

Chinese Office Action for Chinese Application No. 2018107508855, dated Jul. 9, 2020, 8 pages.

* cited by examiner

MOUNTING RACK FOR A POWER ELECTRONICS INSTALLATION AND INSTALLATION COMPRISING A MOUNTING RACK OF THIS KIND

CROSS-REFERENCE TO RELATED APPLICATION

This application claims priority to German Patent application No. DE 10 2017 115 634.8, filed Jul. 12, 2017, which is incorporated by reference herein in its entirety.

FIELD OF THE INVENTION

The present invention relates to a mounting rack for a power electronics installation. The present invention furthermore relates to a corresponding power electronics installation.

BACKGROUND OF THE INVENTION

In electrical engineering, a charging station is any stationary apparatus or electrical installation which serves to supply energy to mobile rechargeable battery-operated devices, machines or motor vehicles by simple placement or insertion, without the energy storage element—for example the traction battery of an electric car—having to be removed. Charging stations for electric cars are sometimes also called "electricity charging stations" and can comprise a plurality of charging points.

In particular, high-performance charging (HPC) systems pursuant to IEC-61851-23, which is incorporated by reference herein, such as the so-called combined charging system (CCS) which is widespread throughout Europe are known in this respect. During direct-current charging of this generic type, direct current is fed from the charging column directly into the vehicle and, for this purpose, provided by way of a powerful rectifier from the power grid or by way of large buffer accumulators at solar charging stations.

Buffer accumulators can also be connected locally in the power grid of the grid operator in order to stabilize the power grid. The vehicle generally contains an OBC (On Board Charger) control device. Said OBC control device communicates with the charging column and the battery management controller.

In this case, the power electronics are usually located in the charging column. Since the direct-current connections of the charging column are connected directly to corresponding connections of the traction battery, high charging currents can be transmitted with low loss, this permitting short charging times but also generating a considerable amount of waste heat.

Conventional charging columns with integrated power electronics up to 50 kW are less than 600 mm deep and have corresponding hatches on the housing in order to allow access to the power electronics.

WO13037392, which is incorporated by reference herein, discloses a charging station having a door, the inner face of said door being used as a carrier for at least one electrical component of the charging station. The door of the charging station is therefore very easily accessible in the open state and therefore permits electrical components to be mounted and wired in a particularly simple manner. Owing to the arrangement of electrical components on the inner face of the door of the charging station, the wiring complexity is intended to be reduced in comparison to charging stations in which all of the electrical components are arranged in or on the housing body (for example on the rear or side wall) of the charging station.

WO13051583, which is incorporated by reference herein, relates to an electric vehicle charging station, the main body of which has a housing space for receiving a power supply apparatus and a holding section on the outer face for holding the charging cable.

SUMMARY OF THE INVENTION

The invention provides a mounting rack for a power electronics installation and also a corresponding power electronics installation according to the independent claims. The approach according to aspects of the invention is based on the idea of incorporating the power electronics system, which is required for converting the electrical energy, in a mounting rack which has a width of 48.26 cm in accordance with the so-called 19-inch rack which is standardized in EIA 310-D, IEC 60297, which is incorporated by reference herein, and DIN 41494 SC48D, which is incorporated by reference herein. Therefore, the power electronics can be distributed in a modular manner between a plurality of relatively small 19-inch assemblies ("inserts"). The high power density of systems of this kind requires compact mounting options for the 19-inch inserts. In addition, the service concept requires rapid and simple mounting and replacement options for the 19-inch inserts both during initial mounting and also during operation.

The advantage of a mounting rack according to aspects of the invention is accordingly found in the ability to service the housing of said mounting rack from only one side, Owing to this property, an embodiment of the invention which is accompanied by correspondingly limited accessibility to the housing is suitable, in particular, when said mounting racks are erected close to a wall or when individual mounting racks are lined up with one another. In addition to its excellent burglary resistance with burglary protection pursuant to resistance class RC 2 (N), the apparatus is additionally distinguished by its modular construction, the ability to replace individual inserts, the option for servicing to be performed by one person while fulfilling occupational health and safety and statutory requirements, the low weight of individual modules, the coolant distributor of said apparatus which is easily accessible at the front of the housing, front-side access to the electrical power connections and also the advantageous power distribution and collection by a rear busbar system.

Further advantageous refinements of the invention are specified in the dependent patent claims.

BRIEF DESCRIPTION OF THE DRAWINGS

An exemplary embodiment of the invention is illustrated in the drawing and will be described in more detail in the text which follows.

DETAILED DESCRIPTION OF THE INVENTION

Figure 1:
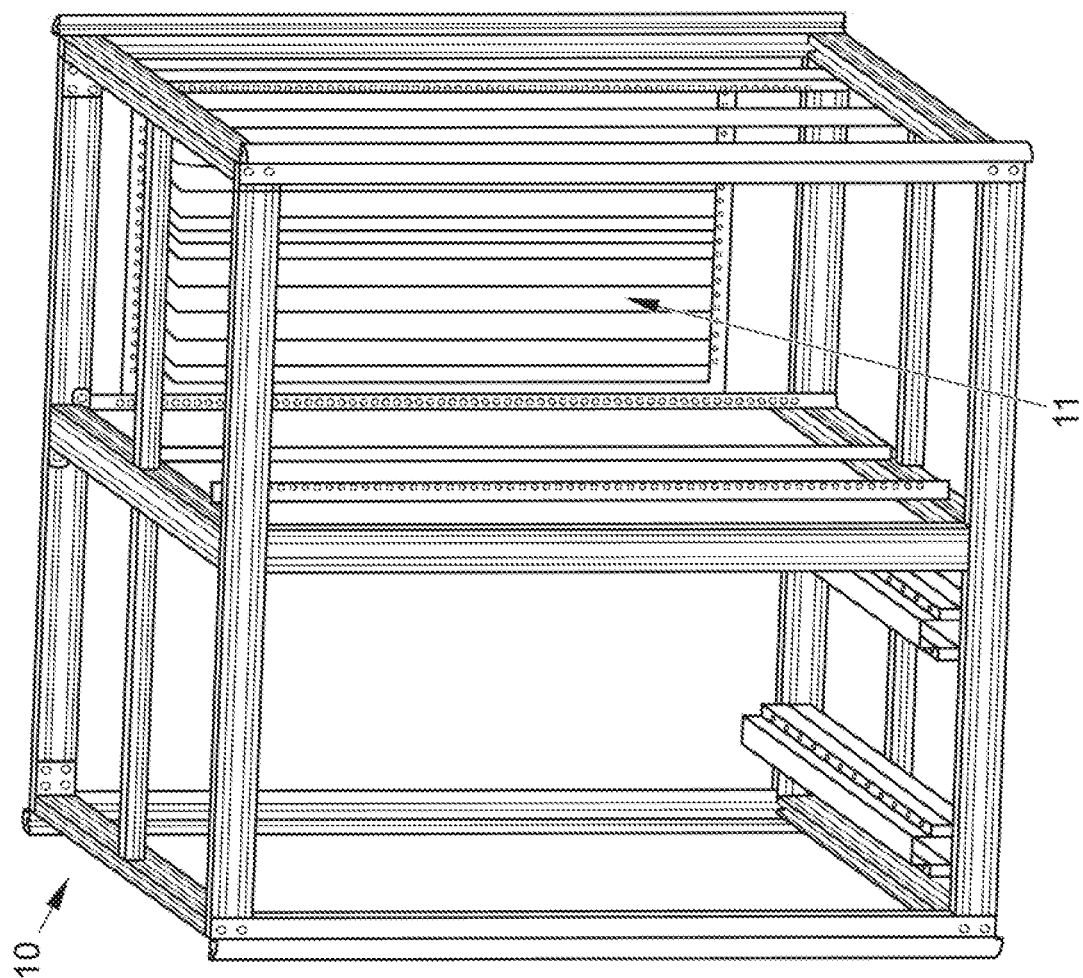
FIG. 1 shows the perspective view of the basic frame of a mounting rack.
Figure 2:
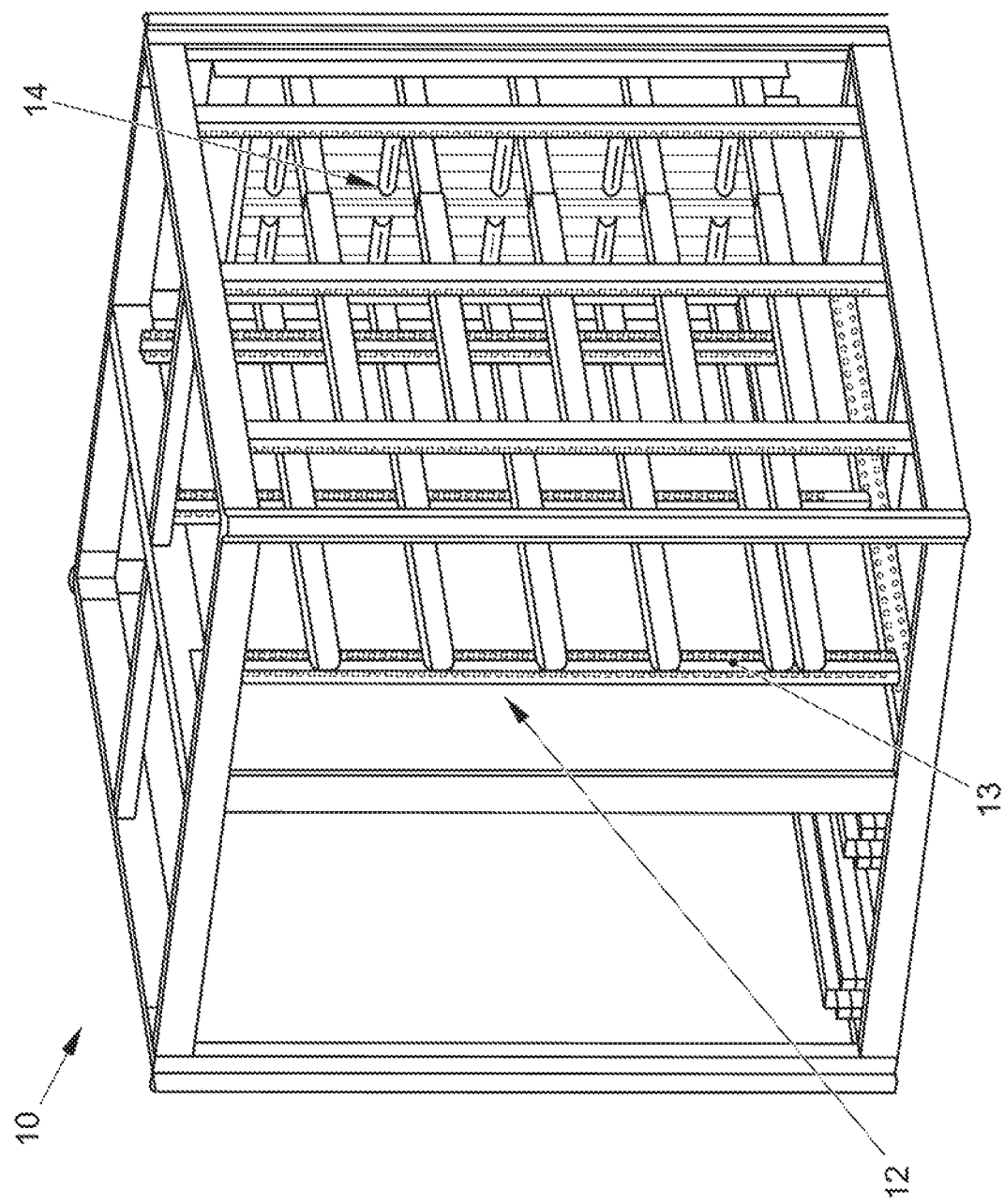
FIG. 2 shows the mounting rack together with mounting rails for power inserts and a junction box.

FIG. 1 illustrates a basic concept of the proposed mounting rack (10): several sets of busbars (11) for electrically connecting the assemblies (17)—not illustrated in the drawing in FIG. 1—are arranged on the rear side of the mounting rack (10). FIG. 2 additionally shows plug-in connectors (14) which are arranged along the busbars (11) and also a 19-inch frame (12) which, for its part, has mounting rails (13) for supporting the assemblies (17).

Figure 3:
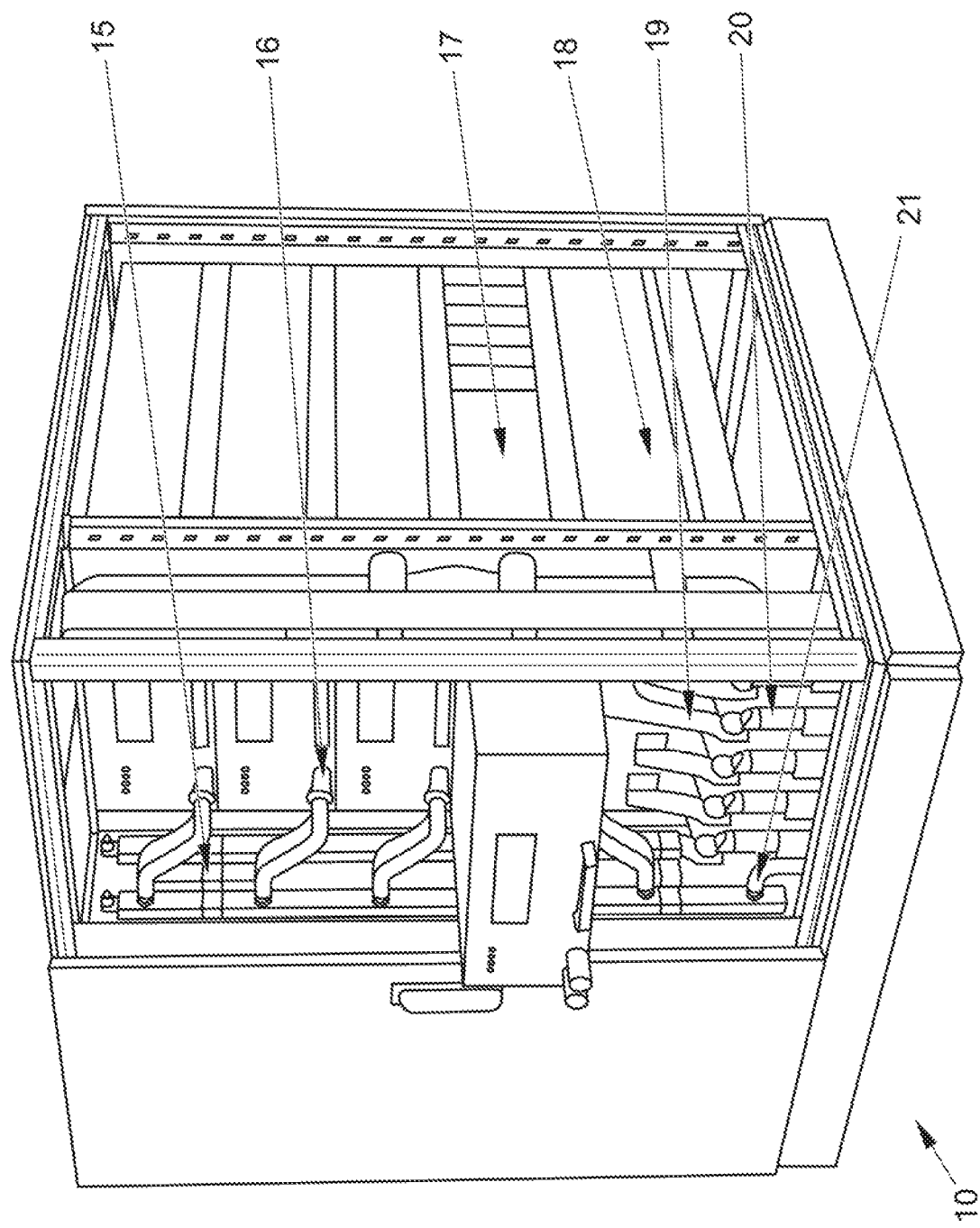
FIG. 3 shows a view of the mounting rack in which it is fully fitted.

The interaction between these structural features can be understood with reference to the complete illustration according to FIG. 3 in which the assemblies (17) are mechanically connected to the coolant distributors which are fitted behind the door, to one another and to the junction box with a front-side set of lines. Owing to the parallel connection thereof by means of the busbars (11), a power of at least 45 kW per module is achieved using silicon carbide technology (SiC). Powers of clearly above 60 kW per insert in the same installation space are possible with gallium nitride technology (GaN). In this case, the rear busbars (11) serve for distributing the AC input current and for collecting the DC output current.

AC input and DC output EMC filters and also AC and DC contactors, overvoltage protection and insulation monitoring which are required for this purpose are jointly combined with a central control unit in a junction box (18) which is arranged beneath the power electronics assemblies (17). Front-side copper rails (19) are provided for the purpose of connecting the junction box (18) to grounding cables (20), said copper rails being able to connect the mounting rack (10), for its part, to further apparatuses of a power electronics installation.

What is claimed is:

1. A mounting rack for a power electronics installation, the mounting rack comprising: busbars arranged on a rear side of the mounting rack for electrically connecting a plurality of assemblies, a vertically extending space disposed between a front side of the mounting rack and a front side of the plurality of assemblies, the front side arranged opposite to the rear side on which the busbars are arranged, a coolant distributor arranged on the front side of the mounting rack and positioned forward of the assemblies, coolant connections on the coolant distributor that are fluidically connected to coolant connections on the assemblies for cooling the assemblies, a coolant connection housing inlet that is fluidically connected to the coolant distributor, wherein the coolant distributor comprises two separate manifolds that are arranged on a same side surface of the mounting rack, and, for each assembly, two coolant carrying tubes are connected between the assembly and the manifolds, and, the coolant connections on the assembly, to which the two coolant carrying cables are connected, are disposed at an elevation below the corresponding coolant connections on the manifolds of the coolant distributor; wherein the coolant carrying tubes extend parallel to each other and in a same direction.

2. The mounting rack as claimed in claim 1, the mounting rack further comprising:
a frame having mounting rails for supporting the assemblies.

3. The mounting rack as claimed in claim 2, wherein:
the frame has plug-in connectors for connecting the assemblies, and
the busbars and the plug-in connectors are arranged in relation to one another such that the assemblies are electrically connected to the busbars when the assemblies are mechanically connected to the plug-in connectors.

4. The mounting rack as claimed in claim 1, the mounting rack further comprising:
a junction box for connecting the mounting rack to grounding cables,
wherein the junction box is arranged in the frame such that it is separately removable.

5. The mounting rack as claimed in claim 1, the mounting rack further comprising:
the assemblies,
wherein the assemblies have an electrical power of at least 45 kW.

6. The mounting rack as claimed in claim 5, wherein:
the assemblies comprise semiconductor circuits, and
the semiconductor circuits comprise silicon carbide or gallium nitride.

7. A power electronics installation comprising a mounting rack as claimed in claim 1.

8. The mounting rack as claimed in claim 1, wherein the coolant distributor is mounted on an interior facing side surface of the rack.

9. The mounting rack as claimed in claim 1, wherein the coolant connection housing inlet is positioned at an elevation beneath the plurality of assemblies.

10. The mounting rack as claimed in claim 1, wherein the coolant connections on the assemblies protrude from said front side of the assemblies.

11. The mounting rack as claimed in claim 1, wherein said front side of the assemblies is recessed from the front side of the mounting rack to accommodate conduits interconnecting the coolant connections on the coolant distributor with the coolant connections on the assemblies.

12. The mounting rack as claimed in claim 1, wherein the coolant connections on the coolant distributor are arranged orthogonally with respect to the coolant connections on the assemblies.

* * * * *